(12) United States Patent
Hwang et al.

(10) Patent No.: US 7,369,588 B2
(45) Date of Patent: May 6, 2008

(54) BROAD-BAND OPTICAL SEMICONDUCTOR DEVICE AND A METHOD FOR MANUFACTURING THE SAME

(75) Inventors: Seong-Taek Hwang, Pyeongtaek-si (KR); Jong-In Shim, Seoul (KR); Dae-Kwang Jung, Suwon-si (KR)

(73) Assignee: Samsung Electronics Co., Ltd., Maetan-Dong, Yeongtong-Gu, Suwon-Si, Gyeonngi-Do (KR)

( * ) Notice: Subject to any disclaimer, the term of this patent is extended or adjusted under 35 U.S.C. 154(b) by 0 days.

(21) Appl. No.: 11/346,974

(22) Filed: Feb. 3, 2006

(65) Prior Publication Data

US 2006/0171430 A1    Aug. 3, 2006

(30) Foreign Application Priority Data

Feb. 3, 2005    (KR) .................. 10-2005-0010094

(51) Int. Cl.
*H01S 3/04* (2006.01)

(52) U.S. Cl. .................. 372/34; 372/36; 372/43.01

(58) Field of Classification Search ............ 372/34–36, 372/43.01
See application file for complete search history.

(56) References Cited

U.S. PATENT DOCUMENTS

| | | | | |
|---|---|---|---|---|
| 4,740,977 A * | 4/1988 | Ikeda | ................. | 372/45.01 |
| 5,341,391 A * | 8/1994 | Ishimura | ................. | 372/46.01 |
| 5,347,526 A * | 9/1994 | Suzuki et al. | ................. | 372/20 |
| 5,404,370 A * | 4/1995 | Otsubo et al. | ................. | 372/45.01 |
| 5,559,819 A * | 9/1996 | Abe et al. | ................. | 372/46.01 |
| 5,568,502 A * | 10/1996 | Hironaka | ................. | 372/50.1 |
| 5,724,376 A * | 3/1998 | Kish, Jr. et al. | ................. | 372/96 |
| 6,621,844 B1 * | 9/2003 | Chua et al. | ................. | 372/46.013 |
| 6,727,109 B2 * | 4/2004 | Ju et al. | ................. | 438/22 |
| 2004/0012845 A1 * | 1/2004 | Wang | ................. | 359/344 |
| 2005/0121682 A1 * | 6/2005 | Shigihara | ................. | 257/98 |

* cited by examiner

*Primary Examiner*—Minsun Oh Harvey
*Assistant Examiner*—Yuanda Zhang
(74) *Attorney, Agent, or Firm*—Cha & Reiter, LLC

(57) ABSTRACT

Disclosed is an optical semiconductor device that provides an optical gain or optical loss depending on application of electric current. The optical semiconductor device comprises: a lower clad layer; an active layer disposed on the lower clad layer, the active layer generating optical gain or optical loss depending on injection of carriers; an upper clad layer disposed on the active layer, the upper clad layer serving to trap light in the active layer in cooperation with the lower clad layer; and a temperature control part for controlling the temperature distribution of the active layer along the light propagation axis in such a manner that temperature of the active layer varies depending on positions in the active layer.

17 Claims, 6 Drawing Sheets

700

BROAD-BAND OPTICAL SEMICONDUCTOR DEVICE AND A METHOD FOR MANUFACTURING THE SAME

CLAIM OF PRIORITY

This application claims priority to an application entitled "BROAD-BAND OPTICAL SEMICONDUCTOR DEVICE," filed in the Korean Intellectual Property Office on Feb. 3, 2005 and assigned Serial No. 2005-10094, the contents of which are hereby incorporated by reference.

BACKGROUND OF THE INVENTION

1. Field of the Invention

The present invention relates to a broad-band optical semiconductor device containing an active layer. In particular, the present invention relates to a broad-band optical semiconductor device which has an extended gain band.

2. Description of the Related Art

Generally, a wavelength division multiplexing passive optical network (WDM-PON) requires a light source that emits light over a broad range of wavelengths. To meet this requirement, a WDM-PON is provided with broad-band optical semiconductor devices, such as semiconductor optical amplifiers (SOA), semiconductor lasers, or other devices that can operate over an extended gain band.

FIG. 1 is a sectional view showing a conventional broad-band optical semiconductor device. The broad-band optical semiconductor device 100 shown in FIG. 1 includes a lower electrode 110, a lower clad layer 120, an active layer 130, an upper clad layer 140, and an upper electrode 150.

The lower clad layer 120 is an n-type compound semiconductor. The lower electrode 110 placed at the bottom of the lower clad layer 120 is connected to the ground and formed from a conductive metal. The active layer 130 placed on the top of the lower clad layer 120 is comprised of the 1st through the nth quantum wells 130-1~130-N, having a thickness increasing gradually from the 1st quantum well to the nth quantum well. The upper clad layer 140 placed on the top of the active layer 130 is a p-type compound semiconductor. The upper electrode 150, where an electric current is applied, is placed on the top of the upper clad layer 140 and formed from a conductive metal.

FIG. 2 is a graph showing the gain curve as a function of wavelengths of the conventional broad-band optical semiconductor device 100 described above. As shown in FIG. 2, the gain v. wavelength curves 210-1~210-N of the 1st through the nth quantum wells 130-1~130-N overlap with one another resulting in a broad-band gain curve 220.

As noted above, the conventional broad-band optical semiconductor device 100 is provided with an active layer 130 that includes multiple quantum wells having thickness that increases gradually to provide an extended gain band. However, one of the problems faced by the broad-band optical semiconductor device 100 described above is that it is impossible to obtain uniform gain. In other words, the broad-band optical semiconductor device 100 shows decrease in efficiency of the gain because carriers (electrons and holes) are injected non-uniformly, depending on the position of a quantum well.

Another problem attributable to the conventional broad-band optical semiconductor device 100 is that use of the active layers containing the quantum wells results in a great change in the gain with respect to the direction of polarization of the incident light.

FIG. 3 is a sectional view of another conventional broad-band optical semiconductor device. The broad-band optical semiconductor device 300 includes a lower electrode 310, a lower clad layer 320, an active layer 330, an upper clad layer 340, a first upper electrode 350, and a second upper electrode 355.

The lower clad layer 320 is an n-type compound semiconductor. The lower electrode 310 comprising a conductive metal is placed at the bottom of the lower clad layer 320 and connected to the ground. The active layer 330 is placed on the top of the lower clad layer 320 and generates optical gain depending on the injection of carriers. The upper clad layer 340, a p-type compound semiconductor, is placed on the top of the active layer 330. The first and the second upper electrodes 350 and 355, which are conductive metals and to which electric current is applied, are placed on the top of the upper clad layer 340. The active layer 330 is divided into a first region 370, to which carriers 360 are injected by way of the first upper electrode 350, and a second region 375, to which carriers 365 are injected by way of the second upper electrode 355.

The first level of current $I_1$ and second level of current $I_2$, different from each other, are applied to the first upper electrode 350 and the second upper electrode 355, respectively. Therefore, the first region 370 and the second region 375 have a different number of carriers, and the first region 370 and the second region 375 have different gain bands.

FIG. 4 is a graph showing the gain curve depending on wavelengths in the above-described broad-band optical semiconductor device 300. As shown in FIG. 4, the gain curve 410 of the first region 370 and the gain curve 420 of the second region 375 overlap with each other, resulting in a broad-band gain curve 430.

As described above, the broad-band optical semiconductor device 300 provides an extended gain band compared to other conventional optical semiconductor devices by varying the carrier number distribution along the light propagation axis. However, the broad-band optical semiconductor 300 is incapable of ensuring sufficient gain band, as change in the carrier number results in a change in the gain band.

SUMMARY OF THE INVENTION

Accordingly, the present invention has been made to solve the above-mentioned problems occurring in the prior art and provide additional advantage by providing a broad-band optical semiconductor device which provides an extended gain band simultaneously with a high and uniform gain.

In accordance to one aspect of the present invention an optical semiconductor device that shows optical gain or optical loss depending on application of electric current is provided. The optical semiconductor device comprises: a lower clad layer; an active layer disposed on the lower clad layer, the active layer generating optical gain or optical loss depending on injection of carriers; an upper clad layer disposed on the active layer, the upper clad layer serving to trap light in the active layer in cooperation with the lower clad layer; and a temperature control part for controlling temperature distribution of the active layer along the light propagation axis in such a manner that temperature of the active layer varies depending on positions in the active layer.

BRIEF DESCRIPTION OF THE DRAWINGS

The above features and advantages of the present invention will be more apparent from the detailed description taken in conjunction with the accompanying drawings, in which.

DETAILED DESCRIPTION OF THE INVENTION

Hereinafter, several aspects of the present invention will be described with reference to the accompanying drawings. For purposes of clarity and simplicity, a detailed description of known functions and configurations incorporated herein are omitted, as they may make the subject matter of the present invention unclear.

The present invention provides optical semiconductor devices containing an active layer that provide a broad-band gain. The present invention utilizes the principle that gain of an optical semiconductor device varies significantly as the band gap of the active layer contained in the optical semiconductor device changes. Moreover, the present invention utilizes the principle that the band gap is affected greatly by change in the temperature, and the fact that the band gap may also be affected by the composition of the active layer and the thickness of a quantum well.

Figure 1:
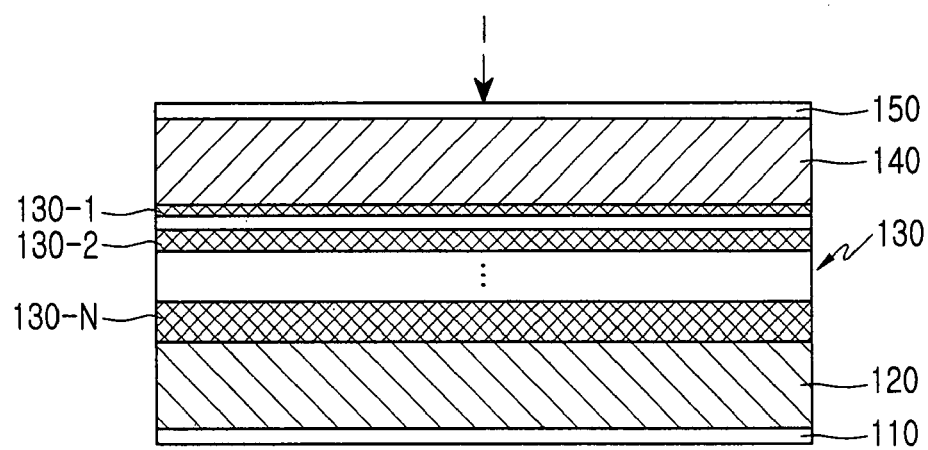
FIG. 1 is a sectional view showing a conventional broad-band optical semiconductor device.
Figure 2:
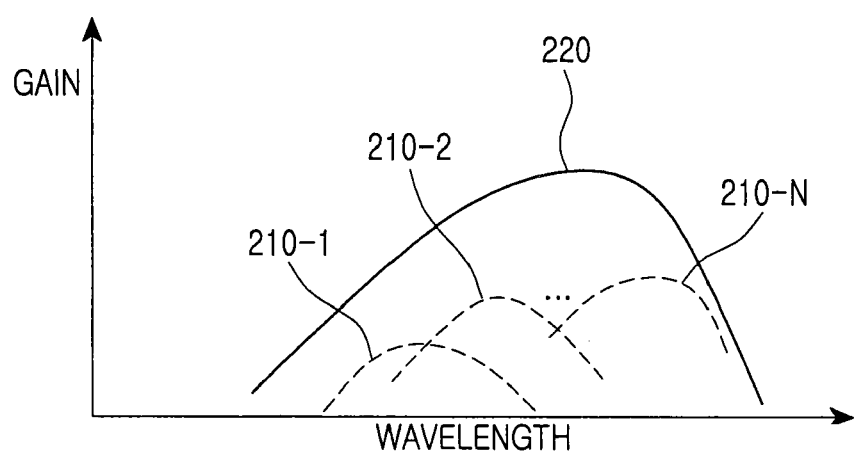
FIG. 2 is a graph showing the gain curve depending on wavelengths in the broad-band optical semiconductor device as shown in FIG. 1.
Figure 3:
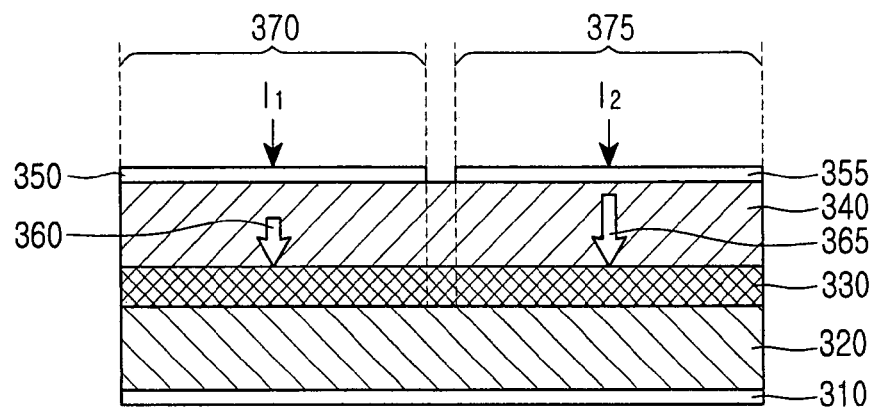
FIG. 3 is a sectional view showing another conventional broad-band optical semiconductor device.
Figure 4:
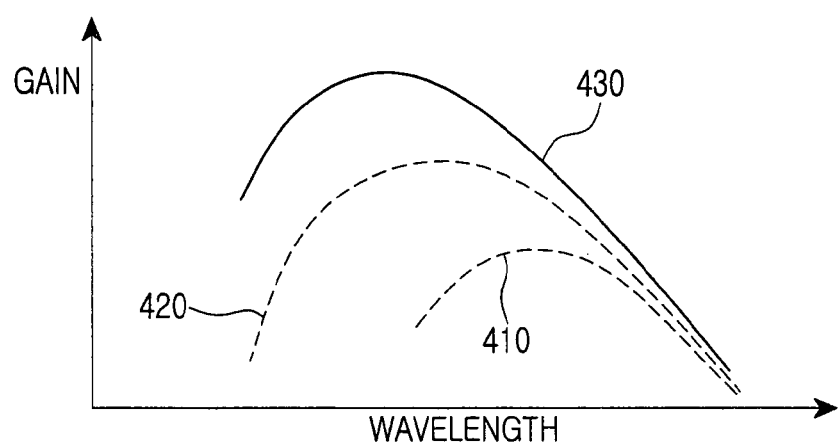
FIG. 4 is a graph showing the gain curve depending on wavelengths in the broad-band optical semiconductor device as shown in FIG. 3.
Figure 5:
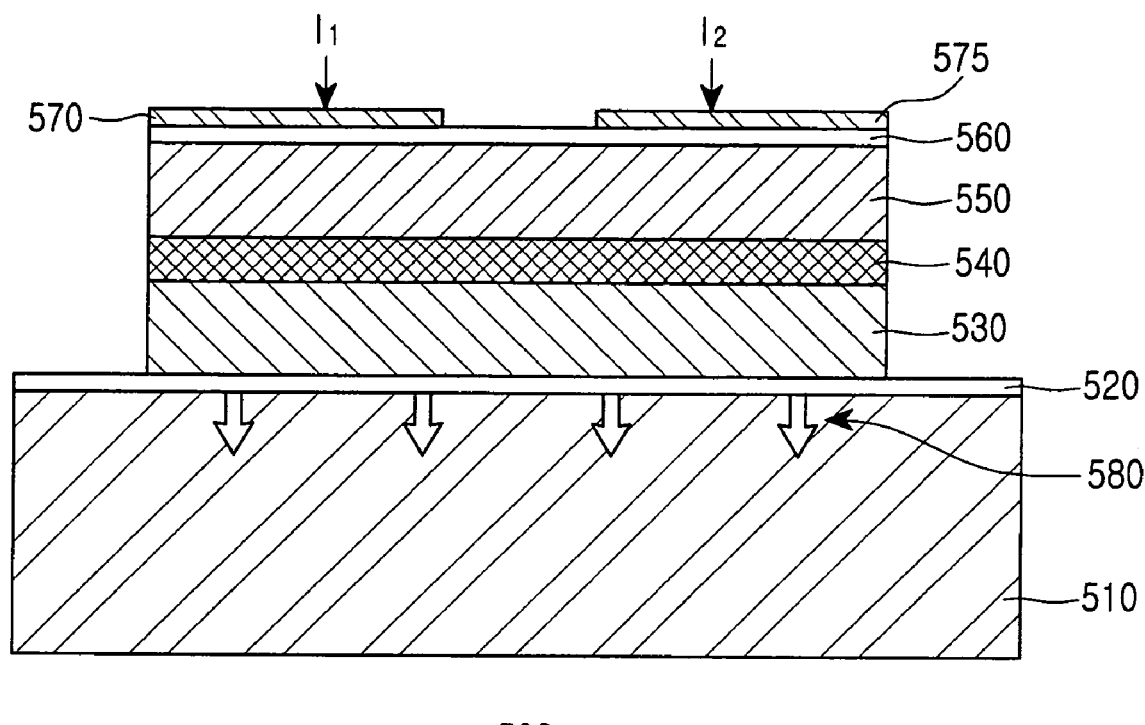
FIG. 5 is a sectional view showing a broad-band optical semiconductor device according to one aspect of the present invention.

FIG. 5 is a sectional view showing a broad-band optical semiconductor device according to one aspect of the present invention. The broad-band optical semiconductor device 500 includes a lower clad 530, a lower electrode 520, an active layer 540, an upper clad 550, an upper electrode 560, and temperature control parts 510, 570 and 575.

The temperature control parts 510, 570 and 575 control the temperature distribution of the active layer 540 along the light propagation axis (the light propagation direction or the longitudinal direction of the active layer 540). In addition, the temperature control parts 510, 570 and 575 comprise a heat sink 510, a first electric resistance layer 570, and a second electric resistance layer 575.

The heat sink 510 discharges the heat transferred from the lower electrode 520 to the exterior. Herein, the heat conductivity at the interface of the heat sink 510 and the lower electrode 520 is maintained at a constant value. In other words, the heat quantity distribution 580 transferred from the lower electrode 520 to the heat sink 510 has a uniform value along the light propagation axis.

The lower electrode 520, a metal, is disposed on the heat sink 510 and connected to ground.

The lower clad layer 530, an n-type semiconductor, is disposed on the lower electrode 520.

The active layer 540 is disposed on the lower clad layer 530 and generates optical gain depending on the injection of carriers. The active layer 540 has a non-uniform temperature distribution along the light propagation axis due to the temperature control parts 510, 570 and 575.

Figure 6A:
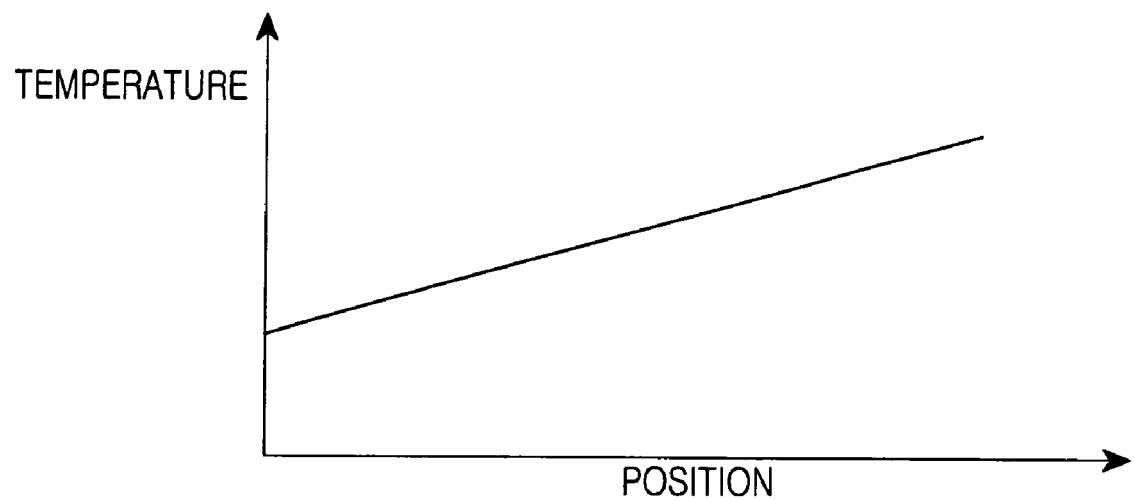
FIG. 6a is a graph showing the temperature distribution of the active layer, depending on the positions in the active layer along the light propagation axis.
Figure 6B:
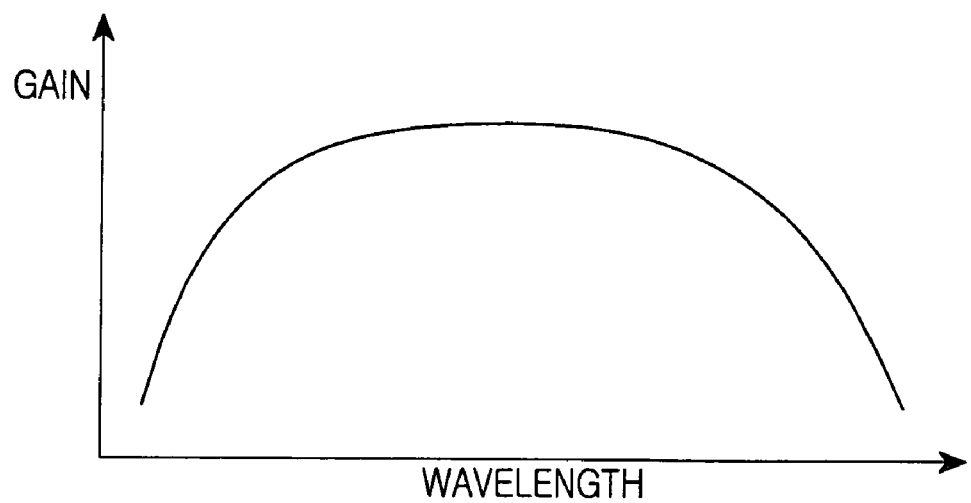
FIG. 6b is a graph showing the gain wavelength depending on the positions in the active layer along the light propagation axis.

FIG. 6A shows the temperature distribution along the light propagation axis within the active layer 540. FIG. 6B shows the gain wavelength along the light propagation axis within the active layer 540. As shown in FIGS. 6A and 6B, the temperature distribution of the active layer is such that the temperature increases gradually from the first end to the second end (i.e. along the light propagation axis) of the active layer 540. Accordingly, the gain wavelength of the active layer 540 shifts from a shorter wavelength to a longer wavelength from the first end to the second end (i.e. along the light propagation axis). In FIG. 6A, the graph showing the temperature distribution depending on positions of the active layer 540 is obtained by linear approximation.

The upper clad layer 550, a p-type semiconductor, is disposed on the active layer 540 and traps light within the active layer 540 in cooperation with the lower clad layer 530.

The upper electrode 560, a conductive metal and to which electric current is applied via the first and the second electric resistance layers 570 and 575, is disposed on the upper clad layer 550.

The first and the second electric resistance layers 570 and 575, disposed on the upper electrode 560 and apart from one another, serve as resistance heaters. In addition, the first level of electric current $I_1$ and a second level of electric current $I_2$, the levels that differ from one another, are applied to the first and the second electric resistance layers 570 and 575, respectively.

Herein, the first and the second electric resistance layers 570 and 575 have the same electric resistance value, and the second electric current $I_2$ is higher than the first electric current $I_1$. In principle, Joule heat is proportional to the square of an applied electric current under a constant electric resistance value. Therefore, the heat quantity of the second electric resistance layer 575 is greater than that of the first electric resistance layer 570.

Further, heat emitted from the first and the second electric resistance layers 570 and 575 contributes to non-uniform temperature distribution of the active layer 540, as shown in FIG. 6A.

Figure 7:
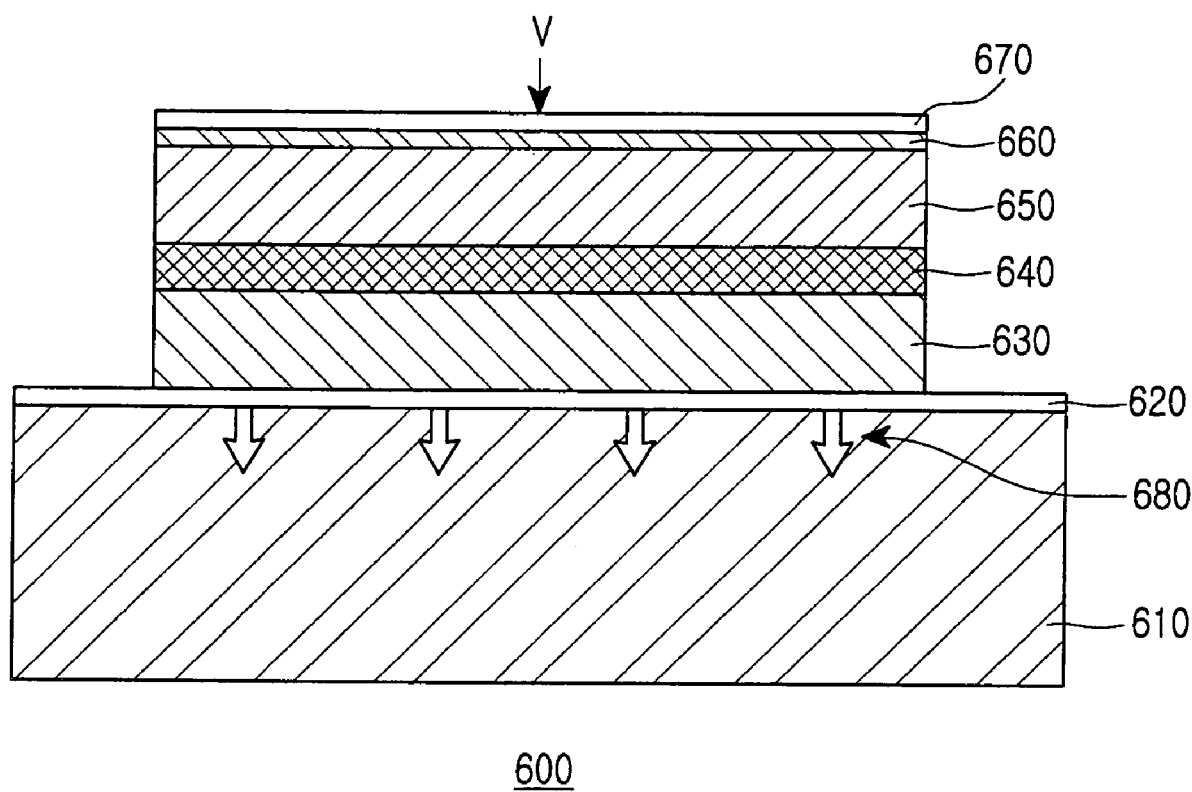
FIG. 7 is a sectional view showing a broad-band optical semiconductor device according to another aspect of the present invention.

FIG. 7 is a sectional view showing a broad-band optical semiconductor device according to another aspect of the present invention. The broad-band optical semiconductor device 600 includes a lower clad 630, a lower electrode 620, an active layer 640, an upper clad 650, an upper electrode 670, and temperature control parts 610 and 660. The temperature control parts 610 and 660, comprised of a heat sink 610 and an electric resistance layer 660, control the temperature distribution of the active layer 640 along the light propagation axis.

The heat sink 610 discharges the heat transferred from the lower electrode 620 to the exterior. Herein, the heat conductivity at the interface of the heat sink 610 and the lower electrode 620 remains constant. In particular, the heat quantity distribution 680 transferred from the lower electrode 620 to the heat sink 610 has a uniform value along the light propagation axis.

The lower electrode 620, a metal, is disposed on the heat sink 610 and connected to the ground.

The lower clad layer 630, an n-type semiconductor, is disposed on the lower electrode 620.

The active layer 640 is disposed on the lower clad layer 630, and generates optical gain depending on the injection of carriers. The active layer 640 has a non-uniform temperature distribution along the light propagation axis due to the temperature control parts 610 and 660. In particular, the temperature distribution of the active layer 640 is such that the temperature increases gradually from the first end to the second end (i.e. along the light propagation axis) of the active layer 640. Accordingly, the gain wavelength of the active layer 640 shifts from a shorter wavelength to a longer wavelength from the first end to the second end (i.e. along the light propagation axis).

The upper clad layer 650, a p-type semiconductor, is disposed on the active layer 640 and traps light within the active layer 640 in cooperation with the lower clad layer 630.

The electric resistance layer 660 is disposed on the upper electrode 650, and the electric resistance distribution is such that the electric resistance increases gradually from the first end to the second end (i.e. along the light propagation axis) of the electric resistance layer 660. In principle, Joule heat is in inverse proportion to the electric resistance value under a constant voltage. Therefore, the heat quantity of the first end is greater than that of the second end. Further, the heat emitted from the electric resistance layer 660 contributes to the non-uniform temperature distribution of the active layer 640 along the light propagation axis.

The upper electrode 670, a conductive metal and to which a voltage V is applied, is disposed on the electric resistance layer 660.

Figure 8:
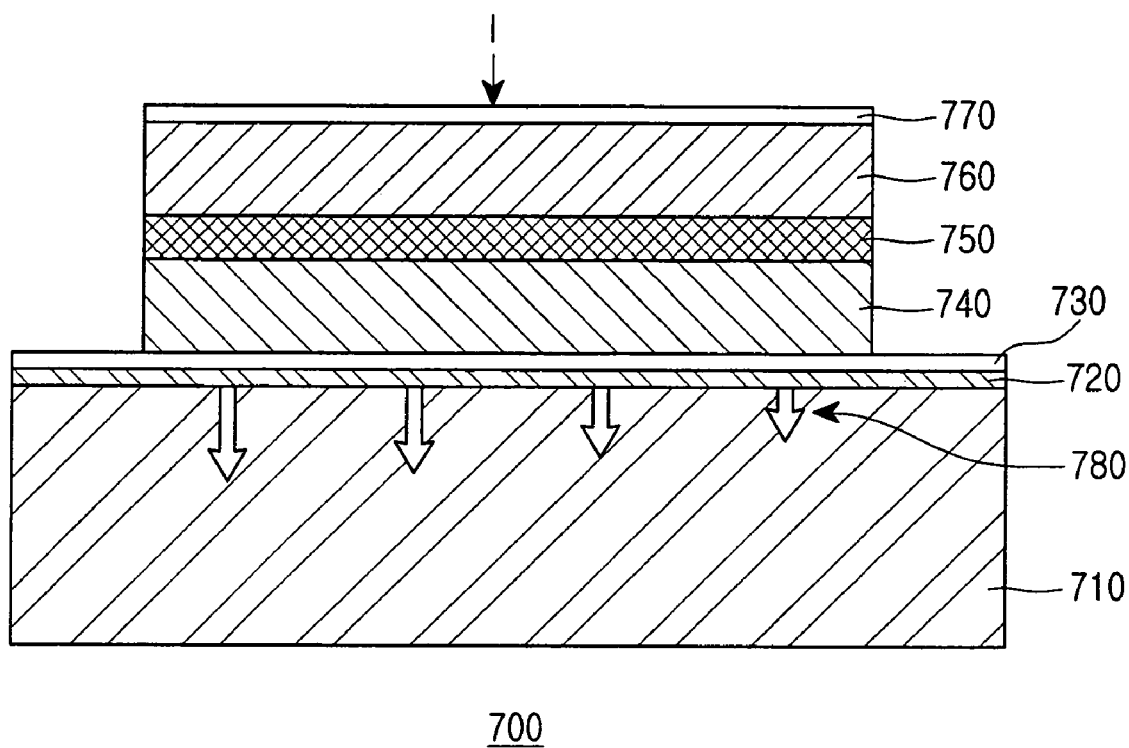
FIG. 8 is a sectional view showing a broad-band optical semiconductor device according to another aspect of the present invention.

FIG. 8 is a sectional view showing a broad-band optical semiconductor device according to another aspect of the present invention. The broad-band optical semiconductor device 700 includes a lower clad 740, a lower electrode 730, an active layer 750, an upper clad 760, an upper electrode 770, and temperature control parts 710 and 720.

The temperature control parts 710 and 720, comprised of a heat sink 710 and a thermal resistance layer 720, controls the temperature distribution of the active layer 750 along the light propagation axis.

The heat sink 710 functions to discharge the heat, transferred from the lower electrode 730 via the thermal resistance layer 720, to the exterior. Herein, the heat quantity distribution transferred to the heat sink 710 along the light propagation axis via the thermal resistance layer 720 is not uniform. In particular, the heat quantity decreases gradually from the first end to the second end (i.e. along the light propagation axis) of the heat sink. Accordingly, the non-uniform distribution of the heat quantity contributes to a non-uniform temperature distribution of the active layer 750 along the light propagation axis.

The thermal resistance layer 720 is disposed on the heat sink 710 and has a thermal resistance distribution where the resistance increases gradually from the first end to the second end (i.e. along the light propagation axis). In particular, the heat passing through the first end is greater than the heat passing through the second end. Such non-uniform thermal resistance distribution of the thermal resistance layer 720 causes the non-uniform distribution of the heat transferred to the heat sink 710, resulting in the non-uniform temperature distribution of the active layer 750 along the light propagation axis.

The lower electrode 730, a conductive metal, is disposed on the thermal resistance layer 720 and connected to the ground.

The lower clad layer 740, an n-type semiconductor, is disposed on the lower electrode 730.

The active layer 750 disposed on the lower clad layer 740 generates optical gain depending on the injection of carriers. The active layer 750 has a non-uniform temperature distribution along the light propagation axis due to the temperature control parts 710 and 720. In particular, the active layer 750 has a temperature distribution where the temperature increases gradually from the first end to the second end (i.e. along the light propagation axis) of the active layer. Accordingly, the gain wavelength of the active layer 750 shifts from a shorter wavelength to a longer wavelength from the first end to the second end (i.e. along the light propagation axis).

The upper clad layer 760, a p-type compound semiconductor, is disposed on the active layer 750 and traps light within the active layer 750 in cooperation with the lower clad layer 740.

The upper electrode 770, a conductive metal and to which electric current I is applied, is disposed on the upper clad layer 760.

As noted above, the present invention utilizes the principle that change in temperature of the active layer results in change in the band gap, particularly the principle that increase in the temperature of the active layer causes decrease in the band gap followed by a shift in the gain wavelength toward a longer wavelength.

The present invention may also be applied to an optical semiconductor device that includes an active layer and that provides optical loss. In this case, the principle regarding change in band gaps due to variations in the temperature of an active layer may be applied in the same manner. In particular, an increase in the temperature of the active layer results in a decrease in the band gap, followed by a shift in the loss wavelength toward a longer wavelength.

Therefore, the present invention may be applied not only to an optical semiconductor device requiring a broad-band gain but also to an optical semiconductor device requiring a broad-band loss.

As noted above, the broad-band optical semiconductor device according to the present invention, which includes a temperature control part and controls the temperature distribution of an active layer along the light propagation axis within the active layer, can provide an extended gain band simultaneously with a high and uniform gain.

In addition, the broad-band optical semiconductor device according to the present invention may be applied not only to an optical semiconductor device requiring a broad-band gain but also to an optical semiconductor device requiring a broad-band loss.

While the invention has been shown and described with reference to certain aspects thereof, it will be understood by those skilled in the art that various changes in form and details may be made therein without departing from the spirit and scope of the invention as defined by the appended claims.

What is claimed is:

1. An optical semiconductor device providing optical gain or optical loss depending on application of electric current comprising:
   a lower clad layer;
   an active layer disposed on the lower clad layer, the active layer being configured to generate optical gain or optical loss depending on injection of carriers;
   an upper clad layer disposed on the active layer, the upper clad layer being configured to trap light in the active layer in cooperation with the lower clad layer;

a temperature control part configured to control temperature distribution of the active layer along a light propagation axis in such a manner that temperature of the active layer varies in the active layer along the light propagation axis comprising:
 a heat sink, on which the lower clad layer is disposed, configured to discharge heat transferred thereto to exterior; and
 a plurality of electric resistance layers being disposed on the upper clad layer and being spaced apart from each other, wherein each electric resistance layer is configured to emit heat depending on application of a different level of electric current, and
a lower electrode interposed between the heat sink and the lower clad layer, wherein heat conductivity at the interface of the heat sink and the lower electrode remains constant.

2. The optical semiconductor device according to claim 1, wherein the optical semiconductor device is configured to provide an extended gain band simultaneously with high and uniform gain.

3. The optical semiconductor device as claimed in claim 1, wherein said plurality of resistance layers comprises:
 an electric resistance layer that is disposed on the upper clad layer and that has an electric resistance distribution of resistance values varying gradually from a first end to a second end, along the light propagation axis, the electric resistance layer emitting heat depending on application of electric current.

4. The optical semiconductor device according to claim 3, wherein the optical semiconductor device is configured to provide an extended gain band simultaneously with a high and uniform gain.

5. The optical semiconductor device as claimed in claim 1, wherein the temperature control part further comprising:
 a thermal resistance layer disposed between the lower clad layer and the heat sink, the thermal resistance layer that has a thermal resistance distribution of resistance values varying gradually from a first end to a second end, along the light propagation axis.

6. The optical semiconductor device according to claim 5, wherein the optical semiconductor device is configured to provide an extended gain band simultaneously with high and uniform gain.

7. The optical semiconductor device as claimed in claim 1, the lower clad layer is an n-type semiconductor.

8. The optical semiconductor device as claimed in claim 1, the upper clad layer is a p-type semiconductor.

9. The optical semiconductor device as claimed in claim 1, wherein the temperature of the active layer increases from one end of the active layer to another end of the active layer, along the light propagation axis.

10. The optical semiconductor device as claimed in claim 1, wherein gain wavelength of the active layer shifts from shorter wavelength to longer wavelength from one end of the active layer to another end of the active layer, along the light propagation axis.

11. A method for manufacturing an optical semiconductor device, the method comprising:
 providing a lower clad layer;
 providing an active layer that generates optical gain or optical loss depending on an injection of carriers on the lower clad layer;
 providing an upper clad layer that traps light in the active layer in cooperation with the lower clad layer on the active layer;
 providing a temperature control part that controls temperature distribution of the active layer along a light propagation axis comprising:
  a heat sink, on which the lower clad layer is disposed, configured to discharge heat transferred thereto to exterior; and
  a plurality of electric resistance layers being disposed on the upper clad layer and being spaced apart from each other, wherein each electric resistance layer is configured to emit heat depending on application of a different level of electric current, and
 providing a lower electrode interposed between the heat sink and the lower clad layer, wherein heat conductivity at the interface of the heat sink and the lower electrode remains constant.

12. The method for manufacturing an optical semiconductor device as claimed in claim 11, the step of providing the temperature control part further comprising:
 providing the lower clad layer on the heat sink; and
 providing an electric resistance layer on the upper clad layer, the electric resistance layer having an electric resistance distribution showing resistance values decreasing gradually from a first end to a second end along the light propagation axis and emitting heat depending on application of electric current.

13. The method for manufacturing an optical semiconductor device as claimed in claim 11, the step of providing the temperature control part further comprising:
 providing the lower clad layer on the heat sink; and
 providing a thermal resistance layer between the lower clad layer and the heat sink, the thermal resistance layer having a thermal resistance distribution showing resistance values increasing or decreasing gradually from a first end to a second end along the light propagation axis.

14. The optical semiconductor device as claimed in claim 1, further comprising an upper electrode interposed between the upper clad layer and the plurality of electric resistance layers.

15. The optical semiconductor device as claimed in claim 3, further comprising an upper electrode, wherein the electric resistance layer is interposed between the upper electrode and the upper clad layer.

16. The method for manufacturing an optical semiconductor device as claimed in claim 11, further comprising
 providing a lower electrode between the heat sink and the lower clad layer; and
 providing an upper electrode between the upper clad layer and the plurality of electric resistance layers.

17. The method for manufacturing an optical semiconductor device as claimed in claim 12, further comprising
 providing a lower electrode between the heat sink and the lower clad layer; and
 providing an upper electrode,
 wherein the electric resistance layer is interposed between upper electrode and the upper clad layer.

* * * * *